United States Patent [19]

Howe

[11] 3,926,684

[45] Dec. 16, 1975

[54] HIGH CRITICAL CURRENT SUPERCONDUCTORS AND PREPARATION THEREOF

[75] Inventor: David G. Howe, Greenbelt, Md.

[73] Assignee: The United States of America as represented by the Secretary of the Navy, Washington, D.C.

[22] Filed: Nov. 25, 1974

[21] Appl. No.: 527,000

[52] U.S. Cl. .................. 148/11.5 R; 148/34; 29/599

[51] Int. Cl.² .......................................... H01L 39/00

[58] Field of Search ............. 29/599; 148/11.5 R, 34

[56] References Cited

UNITED STATES PATENTS

| | | | |
|---|---|---|---|
| 3,763,553 | 10/1973 | Barber et al. | 29/599 |
| 3,811,185 | 5/1974 | Howe et al. | 29/599 |
| 3,857,173 | 12/1974 | Tachikawa et al. | 29/599 |
| 3,874,074 | 4/1975 | Meyer | 29/599 |

*Primary Examiner*—W. Stallard
*Attorney, Agent, or Firm*—R. S. Sciascia; Arthur L. Branning; Thomas McDonnell

[57] ABSTRACT

A composite superconductor which comprises a core selected from the group consisting of a vanadium-gallium (V-Ga) alloy with a gallium content between 8 at. percent and 12.5 at. percent, a niobium-tin (Nb-Sn) alloy with a tin content between 2 and 12 at. percent, and a vanadium-silicon (V-Si) alloy with a silicon content between 4.5 at. percent and 10 at. percent; a matrix selected from the group consisting of copper-gallium (Cu-Ga) alloy with a gallium content from about 16 to about 22 at. percent, a copper-tin (Cu-Sn) alloy with a tin content from about 1 to about 11 at. percent, a copper-silicon (Cu-Si) alloy with a silicon content from about 5 to about 14 at. percent so that an alloy pair from the group consisting of (V-Ga)-Cu-Ga), (Nb-Sn)-(Cu-Sn), and (V-Si)-(Cu-Si) is formed; and an intermediate layer of an A-15 compound selected from the group consisting of $V_3Ga$, $Nb_3Sn$, and $V_3Si$ whereby a correspondence with the selected alloy pair is obtained. A method for producing said composite superconductors by mechanical deformation of a single filament coaxial cylinder consisting of a core rod and a matrix sheath which comprises a homogenization anneal of the core rod and the matrix sheath before assembly thereof, a series of reductions followed by anneals, and a solid state reaction between the core rod and matrix sheath in vacuum or an inert atmosphere and at a temperature from about 475°C to 600°C for the production of $V_3Ga$ and $V_3Si$ and at a temperature from about 525°C to about 750°C for the production of $Nb_3Sn$.

6 Claims, No Drawings

HIGH CRITICAL CURRENT SUPERCONDUCTORS AND PREPARATION THEREOF

BACKGROUND OF THE INVENTION

This invention relates generally to superconductors and in particular to superconductors made from a solid state reaction between two alloys.

Superconductors are usually compared in terms of critical current densities, Jc, and the critical temperature, Tc. Critical current density values indicate the ability of the material to carry large currents. Values are obtained by dividing the critical current by the cross sectional area. The critical current is defined as the maximum current passed through a conductor in a transverse magnetic field before a measurable voltage appears in the conductor.

The critical temperature, Tc, is the temperature at which a material achieves the superconducting property. Since the transition from "normal" to superconduction occurs over a temperature range, values for this parameter have been variously reported at the onstart of superconduction or at the midpoint of the temperature range. For the purposes of this application the critical temperature is the midpoint of the range and hence would be lower than the values reported by the other manner.

Intermetallic compounds having an A-15 crystal structure are known to be exceptional superconducting materials. This structure is also referred to as a beta-tungsten crystalline structure. One of the ways in which these compounds are obtained is by a solid state reaction between two alloys in a vacuum or inert atmosphere at an elevated temperature.

The major difficulty associated with manufacturing superconductors with A-15 compounds is fabricating them into usable configurations. First of all the A-15 compounds are extremely brittle and some of the alloys also become brittle through work hardening. Another problem is the adverse effect impurities may have on the completed composite superconductor. Tightness of the bond between the two alloys producing the A-15 compound and grain size of the resulting A-15 compound are also important considerations.

As a result, research in superconductors is often a two-step process. First a material which is capable of superconduction must be found. Then a process must be devised to fabricate the material in a usable configuration while maintaining superior superconduction. This difficulty is especially prevalent in research with alloys near or in excess of solid solution limits of the metal solute in the metal solvent.

If the solid solution limit of a metal solute in a metal solvent is exceeded, a two phase phenomena is produced in the alloy. The second phase sometimes appears as a precipitation at the grain boundaries of the alloy. In fact, as the concentration of the solute approaches the solid solution limit, discrete particles may begin to faintly form at the grain boundaries. The second phase precipitation at the grain boundaries can provide crack starters and as a result intergranular fractures occur in the rod being processed. On account of the two phase phenomena it was thought that the alloys selected could not exceed the solid solution limit of the solute metal in the solvent metal and that the optimum results would be achieved at a solute concentration of around 2/3 of the solid solution limit.

OBJECTS OF THE INVENTION

It is therefore an object of the invention to provide a method of manufacturing superconductors with near or actual two phase alloys.

Accordingly, it is also an object of this invention to provide superconductors made from near or actual two phase alloys.

A further object is to provide superconductors with a critical temperature above 14.5°K.

A still further object of this invention is to provide a superconductor with a critical current density greater than $1.0 \times 10^6$ amps/cm$^2$ in a transverse magnetic field of 100 kG and greater than $4 \times 10^5$ amps/cm$^2$ at 170 kG.

These and other objects are achieved by composite superconductors made from vanadium-gallium (V-Ga) and copper-gallium (Cu-Ga) or niobium-tin (Nb-Sn) and copper-tin (Cu-Sn) or vanadium-silicon (V-Si) and copper-silicon (Cu-Si) with an increased amount of metal solute and made by a mechanical deformation process which includes a homogenization anneal to improve the uniformity of dispersion in the alloy, several series of anneals during the reduction in cross sectional size of the composite thereby avoiding degradation of the composite by stresses and strains imparted during the mechanical reduction, and a solid state reaction between the two alloys to form the superconducting interfacial layer in a vacuum or in an inert atmosphere at a temperature from about 475° to about 600°C for the vanadium-gallium, copper-gallium composite and for the vanadium-silicon, copper-silicon composite or at a temperature from about 525°–750°C for the niobium-tin, copper-tin composite.

DETAILED DESCRIPTION OF THE INVENTION

The composite superconductor of this invention comprises (1) a core selected from the group consisting of a vanadium-gallium (V-Ga) alloy with a gallium content between 8 at. percent and 12.5 at. percent, a niobium-tin (Nb-Sn) alloy with a tin content between 2 and 12 at. percent, and a vanadium-silicon (V-Si) alloy with a silicon content between 4.5 at. percent and 10 at. percent; (2) an intermetallic layer of an A-15 compound selected from the group consisting of $V_3Ga$, $Nb_3Sn$, and $V_3Si$; and (3) an outer matrix selected from the group consisting of copper-gallium (Cu-Ga) alloy with a gallium content from about 16 to about 22 at. percent, a copper-tin (Cu-Sn) alloy with a tin content from about 1 to about 11 at. percent, a copper-silicon (Cu-Si) alloy with a silicon content from about 5 to about 14 at. percent. With the (V-Ga)-($V_3$Ga)-(Cu-Ga) composite, the preferred gallium content is from 8.1 to 10.1 at. percent for the V-Ga alloy core and the preferred gallium content is from 17.0 to 18.6 at. percent for the Cu-Ga alloy matrix. The preferred tin concentrations for the (Nb-Sn)-($Nb_3$Sn)-(Cu-Sn) composite are from 8.5 to 9.5 at. percent for the Nb-Sn alloy and 8 to 10 at. percent for the Cu-Sn alloy. With the (V-Si)-($V_3$Si-(Cu-Si) composite superconductor, the preferred silicon content is from 5 to 7 at. percent for the V-Si alloy and from 9.2 to 12.0 at. percent for the Cu-Si alloy.

The thickness of the intermetallic may be any thickness, however, thinness of the intermetallic layer is desirable because of the resulting improved critical current density. The preferred thickness is from 0.5 to 3.0 microns. The dimensions for the core and matrix depend on the intended use. For example, a composite wire for the windings of a superconducting magnet would be in the range of 0.010 inch to 0.040 inch diameter. The usual shapes for the composite would be tapes and cylindrical or wire shaped, after which may be wound in a coil.

The method used to prepare the composite superconductors is a modification of the process disclosed in application Ser. No. 344,402, filed Mar. 23, 1973, now U.S. Pat. No. 3,811,185. That disclosure is hereby incorporated herein by reference. It should be noted that the matrix sheath is referred to as simply the sheath in the above reference.

The initial size of the core rod, matrix sheath rod, and end plug may be any size. The size would depend on the length of the final wire. In order to manufacture a long length of wire, the initial thickness of the starting components must be correspondingly large.

The matrix sheath rod is surface cleaned by machining prior to homogenization annealing. The core rod is given the homogenization anneal in the cast condition. Shorter times for the anneal may be used than the following ones of the alloys have a greater initial homogeneity. The duration of the homogenization anneal depends on how thoroughly the alloy was blended during manufacturing prior to the final melting and casting of the rods. For the vanadium-gallium and vanadium-silicon core rods, an anneal at a temperature from about 800° to about 1200°C for about 16 to about 80 hours is used. An anneal temperature from 1,050°C to 1,150°C and an anneal time from 24 to 64 hours are preferred. A homogenization anneal for about 16 to about 80 hours and at a temperature from about 1,100° to about 1400°C is to be used for niobium-tin core rod. The preferred ranges are 24 to 64 hours and 1,200° to 1,300°C. Longer anneal times may be used for the core rods and matrix sheath rods, but the improvement in the product would not equal the additional costs.

There is much latitude with the length of time for all of the anneals of this process. The critical aspects of the numerous anneals of this process are the timing and sequence of their occurrence and the temperatures used. Similarly, the cooling times after the anneals are not critical. Allowing the metal to cool to room temperature without any external cooling means is sufficient. However preferably, alloys from the upper fourth of the disclosed ranges would have faster cooling times than the cooling produced by standing in room temperature. Cooling times for these alloys would be between 30 and 90 minutes. Further all the anneals of this process are conducted in an inert atmosphere or vacuum.

After the homogenization anneal, the core and matrix sheath rods are reduced in diameter by swaging, rolling, or similar techniques. After a reduction of 20 percent in diameter the rods are annealed at a temperature from about 500° to about 525°C for at least 1 hour. Another reduction of 20 percent is made and followed with an anneal like the one above. These reductions and anneals are repeated until the desired diameter is reached. The purpose of starting with a larger size and mechanically reducing to a smaller size rather than starting the smaller size initially is to break up the grains in the alloys. Generally, the diameter of the starting rods are 2 to 3 times larger than the final diameter.

The matrix sheath rod is bored out to form the matrix sheath. The cavity is from about 0.006 inch to about 0.001 inch greater in diameter than the core rod which is to be inserted. Before the core rod is inserted into the outer sheath which forms the matrix of the composite, the core rod is subjected to another anneal at a temperature from about 750°C to about 850°C with 800°C preferred for a period from about 2 to about 16 hours. The one exception to the above is the niobium alloy. For that alloy the annealing temperatures should be increased 300°C. The matrix sheath is also annealed. For all three alloys the annealing temperature is from about 500°C to about 800°C and the annealing time is at least about 1 hour.

After forming the composite according to procedure outlined in the above patent, the composite is then reduced in diameter by swaging, rolling, or by a similar technique. At this point the procedure of this invention defers again from the referenced procedure in that many intermediate anneals are added. After the diameter has been reduced by 20 percent, the composite is heated at a temperature from about 500° to about 525°C for at least 1 hour. The composite is again reduced by 20 percent and another anneal like the previous one is applied to the composite. After the next reduction of 20 percent, the composite is heated at temperatures from about 575° to about 600°C for at least 1 hour. This series of 20 percent reductions followed by an anneal is repeated until the composite reaches a diameter of about 0.080 inch to about 0.090 inch. The composite is then reduced in diameter by wire drawing using the same relationship of 20 percent reductions and intermediate anneals.

As a practical matter the anneal time can be reduced as the diameter of the composite is reduced, so that, at a diameter of about 0.050 inch the anneal time can be as low as 40 minutes. This particular sequence of anneals at the specified temperatures and times are necessary to keep the composite ductile enough to permit further reductions in the cross sectional size of the composite.

After the composite is reduced to the desired cross sectional size, the composite is then heated in the manner described in above referenced U.S. Patent with an extremely important exception. The reaction temperature is reduced to a range from about 475° to about 600°C. The preferred reaction temperature is from 500°C to 550°C. It has been determined that the higher temperatures of the previously referenced process cause the grains of intermetallic compound to be "grown" too large. Smaller grains are desirable because grain boundaries are known to be flux pinning sites in these A-15 intermetallic compounds and with the finer grain sizes more pinning sites are available thereby enabling higher critical current densities to be obtained.

The solid state reaction rate depends on the reaction temperature, the components of the alloy, and their respective concentrations. Hence the practice of this invention would require a person to prepare thickness growth graphs for each particular alloy at the selected reaction temperature.

The general nature of the invention having been set forth, the following example is presented as a specific illustration of the practice thereof. It is understood that the invention is not limited to the example but is susceptible to different modifications that would be recognized by one of ordinary skill in the art.

EXAMPLE I

Preparation of a 0.032 inch single filament composite wire with a core composition of V-9.0 at. percent Ga and with a sheath composition of Cu-17.5 at. percent Ga.

Rods of V-9.0 at. percent Ga alloy and Cu-17.5 at. percent Ga were prepared from high purity metals (99.999 percent Cu, 99.9 percent V, and 99.99 percent Ga). The V-Ga alloy was arc melted and cast as a ½ inch diameter rod. After a homogenization anneal in an evacuated silica ampoule at a temperature of 1,100°C for about 60 hours. The sample was removed from the oven and allowed to cool in the silica ampoule to room temperature. The cooling lasted about 1½ hours.

The rod was swaged at room temperature to ¼ inch diameter and annealed at 800°C for 16 hours. The Cu-Ga alloy was induction melted, cast as a 1¼ inch diameter rod, surface cleaned by machining to 1⅛ inch diameter, and swaged to ½ inch diameter using an anneal at 500°C for 1 hour after each 20 percent reduction. An axial hole to accept the rod was machined to within ⅜ inch of the end of the Cu-Ga rod, and the resulting sheath was then cleaned and annealed at 700°C for 16 hours. Following a final cleaning by chemical etching, V-Ga alloy rod was inserted into the Cu-Ga sheath which in turn was capped with a grooved Cu end plug. The composite assembly was evacuated to a pressure of $1 \times 10^{-5}$ torr and sealed with an electron beam weld.

The sample was then reduced in diameter by the aforedescribed series of swages and anneals.

To illustrate the results obtainable with the superconductors of this invention, the following comparison in Table I is given. The "A" superconductors, the ones encompassed by this invention, were prepared by the aforedescribed method. The "B" and "C" superconductors were prepared by the method disclosed in U.S. Pat. No. 3,811,185.

Table I

Superconducting Properties of $V_3Ga$ Composite Wires

| Specimen | Formation Temp(°C) | Conditions Time (Hrs) | $V_3Ga$ Layer Thickness (Microns) | $T_o$ (°K) | $J_c$ at 4.2°K ($10^5$ Amps/cm$^2$) 60kG | 100kG | 130kG | 160kG |
|---|---|---|---|---|---|---|---|---|
| A1 | 525 | 500 | 0.8 | 15.0 | 13.6 | 7.6 | 5.8 | 2.2 |
| A2 | 550 | 160 | 1.0 | 14.7 | 12.4 | 7.0 | 5.3 | 2.2 |
| A3 | 550 | 400 | 1.6 | 14.9 | 17.1 | 10.1 | 7.9 | 5.1 |
| A4 | 575 | 42 | 1.0 | 14.8 | 10.2 | 5.2 | 4.7 | 3.1 |
| A5 | 575 | 144 | 1.8 | 15.0 | 9.4 | 4.6 | 3.2 | 1.4 |
| A6 | 575 | 400 | 3.1 | 14.8 | 8.8 | 5.5 | 4.0 | 2.1 |
| A7 | 600 | 64 | 2.3 | 14.6 | 8.4 | 5.7 | 4.4 | 2.7 |
| A8 | 700 | 4 | 3.6 | 14.5 | 2.0 | 1.5 | 1.5 | 1.0 |
| B1 | 600 | 64 | 1.0 | 14.1 | 2.8 | 1.7 | 1.5 | 0.7 |
| B2 | 600 | 400 | 2.5 | 14.4 | 2.2 | 1.5 | 1.2 | 0.7 |
| B3 | 700 | 2.5 | 1.0 | 13.5 | 1.3 | 0.9 | 1.1 | 0.5 |
| B4* | 550 | 747 | 1.0 | 14.3 | 5.9 | 3.2 | 2.0 | 1.1 |
| B5* | 575 | 210 | 1.0 | 14.0 | | 3.1 | 2.1 | 1.3 |
| C1 | 575 | 500 | 1.0 | 14.2 | 1.5 | 0.9 | 0.8 | 0.6 |
| C2* | 575 | 500 | 1.0 | | 4.4 | 2.8 | 1.9 | 1.2 |
| C3 | 600 | 100 | 1.0 | 14.1 | 1.2 | 0.8 | 0.8 | 0.3 |
| C4* | 600 | 100 | 1.0 | | 2.9 | 2.0 | 1.3 | 0.6 |
| C5 | 600 | 500 | 2.3 | 14.3 | 1.2 | 0.8 | 0.6 | |
| C6* | 600 | 500 | 2.3 | 14.3 | 1.9 | 1.4 | 1.0 | 0.6 |
| C7* | 700 | 5 | 1.0 | 13.6 | 1.7 | 0.7 | 0.2 | 0.1 |

All specimens are 0.032" diameter wires except for those indicated by an asterisk - these are 0.010" diameter wires.
A = V-9.0 at % Ga/Cu-17.5 at. % Ga
B = V-6.1 at. % Ga/Cu-15.4 at. % Ga
C = Pure-V/Cu-15.4 at. % Ga Critical currents ($I_c$) of the $V_3Ga$ layer formed in the composite wires were measured (using a 4-contact technique) in transverse magnetic fields up to 175 kG. The signal to noise ratio encountered with the Bitter type solenoids dictated that a 5M V drop across a 1 cm length of wire be used as the criterion for $I_c$. $J_c$ was calculated from the $I_c$ values and the measured $V_3Ga$ cross sectional areas. The cross sectional areas were obtained by actual measurements of the peripheries of the cores and has been explained in detail in U.S. Pat. No. 3,811,185. Transition temperatures ($T_o$) were measured by a low-frequency (27 Hz) ac mutual inductance technique. The temperature values reported are the midpoints of the transitions as measured by a germanium thermometer.

As was demonstrated, the superconductors of this invention are significantly improved over the superconductors made from similar but less concentrated alloys and by known methods. In fact the $J_c$'s of specimen $A_4$ are the highest ever reported for any superconductive material in magnetic fields of the above intensity. See NRL Progress Report, Dec. 1973, pp. 27–29.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. A composite superconductor which comprises:

a core selected from the group consisting of a vanadium-gallium alloy with a gallium content between 8 at. percent and 12.5 at. percent, a niobium-tin alloy with a tin content between 2 and 12 at. percent, and a vanadium-silicon alloy with a silicon content between 4.5 at. percent and 10 at. percent;

a matrix selected from the group consisting of copper-gallium alloy with a gallium content from about 16 to about 22 at. percent, a copper-tin alloy with a tin content from about 1 to about 11 at. percent, a copper-silicon alloy with a silicon content from about 5 to 14 at. percent, so that the matrix alloy has the same metal solute as the core alloy; and an intermediate layer of an A-15 compound produced by a solid state reaction between said core rod and said matrix sheath.

2. The composite superconductor of claim 1, wherein: said core is selected from the group consisting of a vanadium-gallium said with a gallium content greater than 8.0 at. percent and up to 10.1 at. percent, a niobium-tin alloy with a tin content from 8.5 to 9.5 at. percent, and a vanadium-silicon alloy with a silicon content from 5 to 7 at. percent; and said matrix is selected from the group consisting of a copper-gallium alloy with a gallium content from 17 to 18.6 at. percent, a copper-tin alloy with a tin content from 8 to 10 at. percent, and a copper-silicon alloy with a silicon content from 9.2 to 12.0 at. percent.

3. The composite superconductor of claim 1, wherein:

said core is a vanadium-gallium alloy with a gallium content between 8 at. percent and 12.5 at. percent; and said matrix is a copper-gallium alloy with a gallium content from about 16 to about 22 at. percent.

4. The composite superconductor of claim 3 wherein the gallium content of said core is greater than 8 at. percent and up to 10.1 at. percent and the gallium content of said matrix is from 17.0 to 18.6 at. percent.

5. The composite superconductor of claim 4 wherein the thickness of said intermediate layer is from 0.5 to 3 microns.

6. A method for fabricating composite superconductors which comprises:

homogenization annealing a core rod and a matrix sheath rod;

reducing said rods by mechanical techniques;

boring said matrix rod to form a matrix sheath;

forming an end plug having axial grooves about its periphery;

annealing said core rod at a temperature from about 750° to about 850°C for about 2 to about 16 hours if V-Ga or V-Si is selected, wherein a temperature of about 1050°C to about 1,150°C is to be used for Nb-Sn;

annealing said matrix sheath at temperatures from about 500°C to about 800°C for at least about one hour;

etching said core rod with a $HNO_3$-HF solution;

placing said core rod within said matrix sheath whereby a composite is formed having an annular air space between said matrix sheath and said core rod, said plug being of different length to overlap the end of said matrix sheath;

subjecting said composite to a vacuum;

sealing said composite while under a vacuum;

reducing the diameter of said composite by 20 percent;

annealing said composite at a temperature from about 500° to 525°C for at least one hour;

reducing the diameter of said composite by 20 percent;

annealing said composite at a temperature from about 500° to about 525°C for at least 1 hour;

reducing the diameter of said composite by 20 percent;

annealing said composite at a temperature from about 575° to about 600°C for at least one hour;

repeating the previous reduction steps until the desired diameter of the composite is obtained; and heating said composite at about 475°C to about 600°C if said composite is V-Ga, Cu-Ga or V-Si, Cu-Si, whereas if said composite is Nb-Sn, Cu-Sn, the temperature is to be about 525°C to about 750°C.

* * * * *